US011189507B2

(12) United States Patent
Yu et al.

(10) Patent No.: US 11,189,507 B2
(45) Date of Patent: Nov. 30, 2021

(54) CHIP PACKAGING APPARATUS AND METHOD THEREOF

(71) Applicant: CAPCON LIMITED, Hong Kong (CN)

(72) Inventors: Feng Yu, Singapore (SG); Hong Gang Wang, Singapore (SG); Yang Li, Singapore (SG); Yong Xin Wang, Singapore (SG)

(73) Assignee: CAPCON LIMITED, Hong Kong (CN)

( * ) Notice: Subject to any disclaimer, the term of this patent is extended or adjusted under 35 U.S.C. 154(b) by 315 days.

(21) Appl. No.: 16/084,611

(22) PCT Filed: Mar. 14, 2016

(86) PCT No.: PCT/CN2016/076233
§ 371 (c)(1),
(2) Date: Sep. 13, 2018

(87) PCT Pub. No.: WO2017/156671
PCT Pub. Date: Sep. 21, 2017

(65) Prior Publication Data
US 2019/0080942 A1 Mar. 14, 2019

(51) Int. Cl.
*H01L 21/67* (2006.01)
*H01L 21/687* (2006.01)
(Continued)

(52) U.S. Cl.
CPC .. *H01L 21/67121* (2013.01); *H01L 21/67098* (2013.01); *H01L 21/67144* (2013.01);
(Continued)

(58) Field of Classification Search
CPC ......... H01L 21/67098; H01L 21/67121; H01L 21/67144; H01L 21/67721; H01L 21/67742
See application file for complete search history.

(56) References Cited

U.S. PATENT DOCUMENTS 5,671,530 A * 9/1997 Combs .............. H01L 21/67144
29/426.3
5,765,277 A * 6/1998 Jin ..................... H01L 21/67144
29/743
(Continued)

FOREIGN PATENT DOCUMENTS

| CN | 102339771 A | 2/2012 |
|---|---|---|
| CN | 104183527 A | 12/2014 |
| CN | 104701199 A | 6/2015 |

OTHER PUBLICATIONS

International Search Report and Written Opinion for corresponding International Application No. PCT/CN2016/076233 dated Dec. 21, 2016 with English translation of International Search Report.
(Continued)

*Primary Examiner* — Minh N Trinh
(74) *Attorney, Agent, or Firm* — Renner, Otto, Boisselle & Sklar, LLP

(57) ABSTRACT

Disclosed is a chip packaging apparatus. The chip packaging apparatus comprises: at least one chip supplying device; at least one chip processing device configured to process a chip supplied by a corresponding chip supplying device; and at least one chip transferring device, wherein each chip transferring device has a plurality of bonding heads, and each of the bonding heads is used to transfer one chip processed by a corresponding chip processing device. Each chip processing device comprises at least two pick-up platforms, each of the pick-up platforms is configured such that multiple chips can be simultaneously provided thereon, and the plurality of
(Continued)

bonding heads on a corresponding chip transferring device is configured to simultaneously pick up multiple chips from each pick-up platform in one operation. A method for packaging chips is also disclosed.

12 Claims, 11 Drawing Sheets

(51) Int. Cl.
*H01L 21/677* (2006.01)
*H01L 23/00* (2006.01)
*H01L 25/00* (2006.01)

(52) U.S. Cl.
CPC .. *H01L 21/67721* (2013.01); *H01L 21/67742* (2013.01); *H01L 21/68742* (2013.01); *H01L 21/68764* (2013.01); *H01L 24/75* (2013.01); *H01L 24/81* (2013.01); *H01L 24/83* (2013.01); *H01L 24/95* (2013.01); *H01L 25/50* (2013.01); *H01L 2224/14181* (2013.01); *H01L 2224/16145* (2013.01); *H01L 2224/16227* (2013.01); *H01L 2224/2919* (2013.01); *H01L 2224/32225* (2013.01); *H01L 2224/73253* (2013.01); *H01L 2224/8388* (2013.01); *H01L 2225/06513* (2013.01); *H01L 2225/06517* (2013.01); *H01L 2225/06565* (2013.01); *H01L 2924/14* (2013.01)

(56) References Cited

U.S. PATENT DOCUMENTS

| | | | |
|---|---|---|---|
| 6,739,043 B2 * | 5/2004 | Shirakawa | H05K 13/021 29/740 |
| 10,734,349 B2 * | 8/2020 | Yu | H01L 24/11 |
| 2019/0080942 A1 * | 3/2019 | Yu | H01L 24/75 |

OTHER PUBLICATIONS

International Preliminary Report on Patentability for corresponding International Application No. PCT/CN2016/076233 dated Aug. 9, 2018.

\* cited by examiner

CHIP PACKAGING APPARATUS AND METHOD THEREOF

This application is a national phase of International Application No. PCT/CN2016/076233 filed Mar. 14, 2016.

FIELD OF THE INVENTION

The invention relates to an advanced packaging technology in semiconductor industry, particularly to an apparatus and a method for producing chips.

BACKGROUND OF THE INVENTION

The production of microelectronic circuits includes packaging of chips, that is, mounting the chips on a substrate or wafer. The substrate plays roles of placing, fixing, protecting the chip and enhancing the electrothermal performance, and is also a bridge between the chips and the external circuit. Electrical contacts on the chip are electrically connected to the substrate, and then establish electrical connections through the substrate and other components. Therefore, packaging plays an important role in integrated circuits. There are many ways to package, including wire bonding, tape automated bonding(TAB), flip-chip bonding, and regular bonding. In a flip-chip bonding process, the chips are disposed onto the substrate and bumps of the chips for making electrical connections with the external components face downward to the substrate. The basic workflow includes picking up the chips from the wafer, flipping the chip upside down, applying flux to the chips, aligning the chips to be in the correct position at an inspection camera, and bonding the chips to the substrate. In the regular bonding process, the chips are disposed on the substrate and the bumps of the chip face upwards, that is, the bumps of the chip face away from the substrate. Therefore, comparing to the flip-chip bonding process, a regular bonding process does not require the step of flipping.

At present, consumer demand for electronic products that implement microelectronic chips is constantly increasing. And competitions between products is becoming increasingly fierce. In order for a microelectronic product to win in this competition, time-to-market of the product is critical. In other words, time of a process from design to launch of the product must be as short as possible to introduce the most innovative and technologically advanced products. To this end, manufacturers of microelectronic products have been eager to own more innovative technologies to improve productivity and reduce unit costs to provide products that are technologically leading and cost-effective. In addition, the products are desired to be more functional. One way to achieve this is to bond different types of chips to the same substrate to obtain circuits that can complete more complicated tasks.

In the prior art, chip packaging apparatus typically comprises only one bond head that repeatedly move between a wafer and a substrate, and the bond head can bond one chip to the substrate in each cycle. For a conventional bonding device, if it is desired to increase the production efficiency, the only way is to accelerate running speed of the device. However, it has been found in production practice that the effect of obtaining higher productivity by increasing the running speed of the device is very limited, because the chips are picked up and bonded one by one, and the work cycle related to one chip can begin only after the work cycle related to the previous chip is completed.

In addition, conventional chip packaging apparatus can only handle one type of wafer in a single workflow, so that only one type of chips can be bonded to one substrate. If multiple types of chips are desired to be bonded on the same substrate at the same time, multiple devices should be combined together. This way of combination of multiple devices makes the production line extremely large and complex. And the reliability cannot be assured.

For this reason, there is still a technical need in the prior art to further improve the productivity of chip packaging. It is also desirable to handle more complicated packaging process in a single apparatus.

SUMMARY OF THE INVENTION

In one aspect, the invention provides a chip packaging apparatus comprising at least one chip supply device, at least one chip processing device configured to process the chip provided by the corresponding chip supply device, and at least one chip transfer device. Each chip transfer device has multiple bond heads. Each bond head for transferring one of the chips processed by the corresponding chip processing device. Each chip processing device comprises at least two pick-up platforms, each of which is constructed to arrange multiple chips. The multiple bond heads on the corresponding chip transfer device are configured to pick up multiple mentioned chips simultaneously from each pick-up platform at one time.

In the chip packaging apparatus according to the present invention, since at least two pick-up platforms are provided, multiple pick-up platforms can be set to take turns to chip loading, thereby realizing uninterrupted operation of the chip processing and effectively improving the efficiency of the chip packaging apparatus.

Meanwhile, since the pick-up platforms in the chip processing device of the chip packaging apparatus can simultaneously arrange a plurality of chips, multiple bond heads of the chip transfer device in the apparatus can be correspondingly disposed to the multiple chips on the pick-up platform, such that the multiple bond heads can simultaneously pick up the multiple chips from the pick-up platform at one time. Such a structure can greatly improve the productivity of the apparatus compared to the prior art in which the bond head directly detects, selects, aligns, and picks up the chip from, for example, the wafers.

Preferably, each chip processing device comprises a first pick-up platform and a second pick-up platform. The corresponding chip transfer device picks up multiple chips from the first pick-up platform and the second pick-up platform. The two pick-up platforms are provided and are arranged to be alternately in the loading position and in the picking position. Thus, the chip processing apparatus can continue to work while one pick-up platform completes the loading step and begins picking step. And the other pick-up platform implements a chip-loading step, thereby realizing the uninterrupted work of the chip processing device, and effectively improving the efficiency of the chip packaging apparatus.

Preferably, each pick-up platform is movable between the loading position and the picking position. The pick-up platforms are adapted to be loaded with multiple chips when in the loading position, and the pick-up platforms are adapted to have the multiple bond heads simultaneously pick up the multiple chips when in the picking position.

Preferably, each said chip processing device is arranged such that the first pick-up platform and the second pick-up platform are alternately in the loading position and in the picking position.

Preferably, the chip packaging apparatus has a first chip supply devices and a second chip supply device that operate independently.

Preferably, the first chip supply device and the second chip supply device respectively provide different chips.

Preferably, the chip packaging apparatus has the first chip processing device and the second chip processing device that operate independently, and they respectively process chips provided by the corresponding first chip supply device and the second chip supply device.

Preferably, the chip packaging apparatus has the first chip transfer device and the second chip transfer device that operate independently, and they respectively transfer chips processed by the corresponding first chip processing device and the second chip processing device.

Preferably, the chip packaging apparatus further comprises a bonding platform. The substrate is disposed on the bonding platform, and the chip is bonded to the substrate by the bond head.

Preferably, the bonding platform is provided with a heating device that is adapted to heat the substrate disposed on the bonding platform to bond it to the chip.

In another aspect, the present invention provides a method for packaging a chip, comprising: providing a first chip processing device, and the first chip processing device comprises a first pick-up platform and a second pick-up platform; moving the first pick-up platform and the second pick-up platform alternately to the loading position and the picking position, wherein the pick-up platform is adapted to be loaded with the multiple chips when in the loading position, and the pick-up platform is adapted to have the multiple bond heads, which is disposed on the chip transfer device, simultaneously pick up the multiple chips when in the picking position.

Preferably, a second chip processing device is also provided, and the second chip processing device and the first chip processing device process different chips independently.

Preferably, a bonding platform is further provided, and the bonding platform is used for placing wafer, and the chip is bonded to the wafer by the bond head.

Preferably, further comprises activating a heating device on the bonding platform, to heat the wafer disposed on the bonding platform in order to bond the chip to the wafer.

Preferably, said chip transfer device is further provided with the camera for detecting multiple chips on the pick-up platform one by one to determine whether position of each chip meets the requirements.

Preferably, the chip transfer device places the chips onto the substrate one by one to perform bonding.

Other aspects and further advantages of the present invention be described hereinafter with reference to the specific examples and the figures.

DETAILED DESCRIPTION OF THE EMBODIMENTS

Before illustrating any embodiment of the present invention in detail, it is to be understood that the application of the invention is not limited to the details of the construction of the invention and the process of the method as illustrated in the following description. The invention could comprise other embodiments and can be practiced or implemented in a variety of different ways.

As used herein, a term "chip" may also be referred to as "die", but those skilled in the art will understand that components or products suitable for use in the apparatus and methods of the present invention include a die or a chip, such as but not limited to, a die, an integrated circuit (IC), a discrete device, modules, a module. These components or products should be considered equivalent to "chip" or die in this context.

Herein, terms "upward", "downward", "left", "right", "front", "back", "inside", "outside", "horizontal", "longitudinal", "intermediate", "lateral", etc., unless otherwise specified, describes the orientations shown in the figures.

Herein, terms "first", "second", etc. are used merely to distinguish different device or step to indicate that the device or step is independent with each other, but are not used to define the limitation in aspects, such as importance, order and location, of the device or step.

The chip packaging apparatus and method according to the present invention can be used to process a variety of suitable chips. However, as an example, specific embodiments thereof are specifically described below consisting processing of integrated chips only. Those skilled in the art will understand that the chips in these embodiments can also be replaced with other suitable chips in accordance with the spirit and principles of the present invention, and such embodiments also fall within the scope of the present invention.

Figure 1:
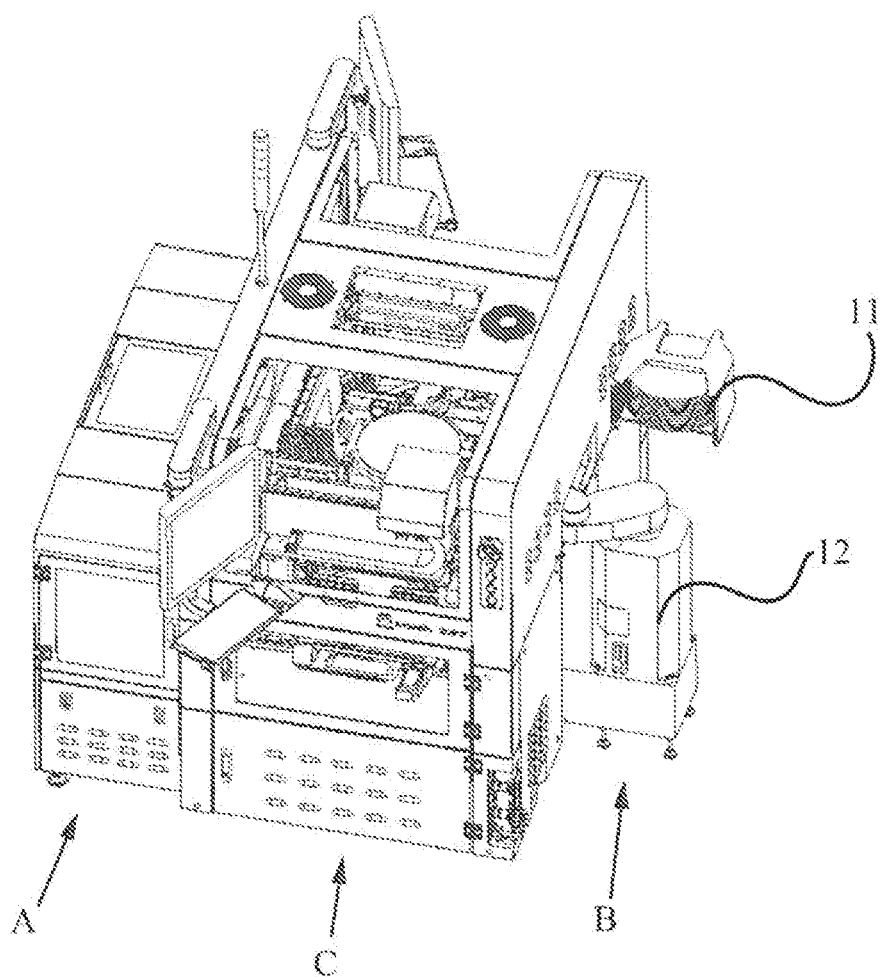
FIG. 1 shows a perspective view of the chip packaging apparatus in one example of the invention.

FIG. 1 shows a specific chip packaging apparatus according to the present invention. In general, in the lateral direction, the chip packaging apparatus is mainly composed of a chip supply part A, a chip processor part C, and a substrate supply part B. The substrate supply part B includes a substrate holder 11 and a robot arm 12. During the processing, a wafer cassette is provided to the chip supply part A, and the robot arm 12 takes a substrate from the substrate holder 11 and places it at a predetermined position in the processor part C, and then completes the processing.

That is, a chip on the wafer is bonded to the substrate until the desired package is completed. The apparatus shown in the figures has a housing mounted on the frame and a plurality of doors that can be opened and closed such as wafer cassette loading doors, beam doors, etc., which are used to load items such as chips or substrates, or for mounting, observing, or inspecting the various modules or components of the apparatus. Therefore, the settings of these doors can be set according to specific needs, and can be set to start the apparatus and perform the operation only when all the doors are safely closed.

It should be noted that those skilled in the art can understand that the substrate described herein generally refers to any carrier that can be used to carry a chip or other microelectronic components. It can be a substrate, a base, a wafer, etc.

Figure 2:
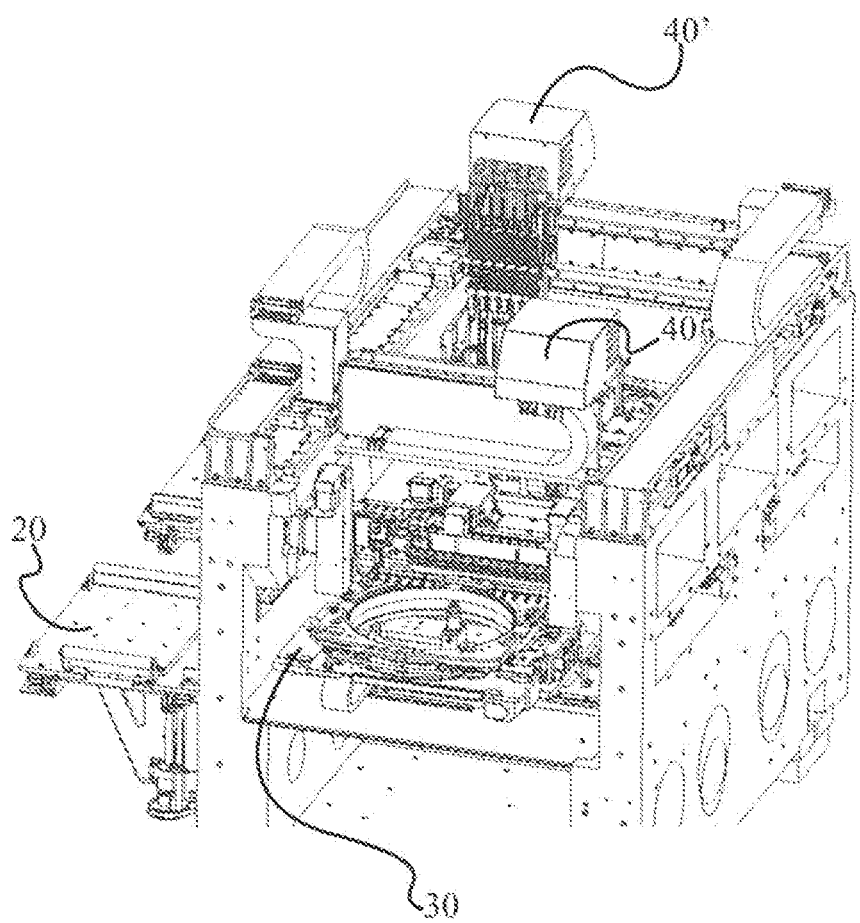
FIG. 2 shows a partial perspective view of the chip packaging apparatus shown in FIG. 1, where part of housing and some devices are removed to better illustrate internal construction of the apparatus.
Figure 3:
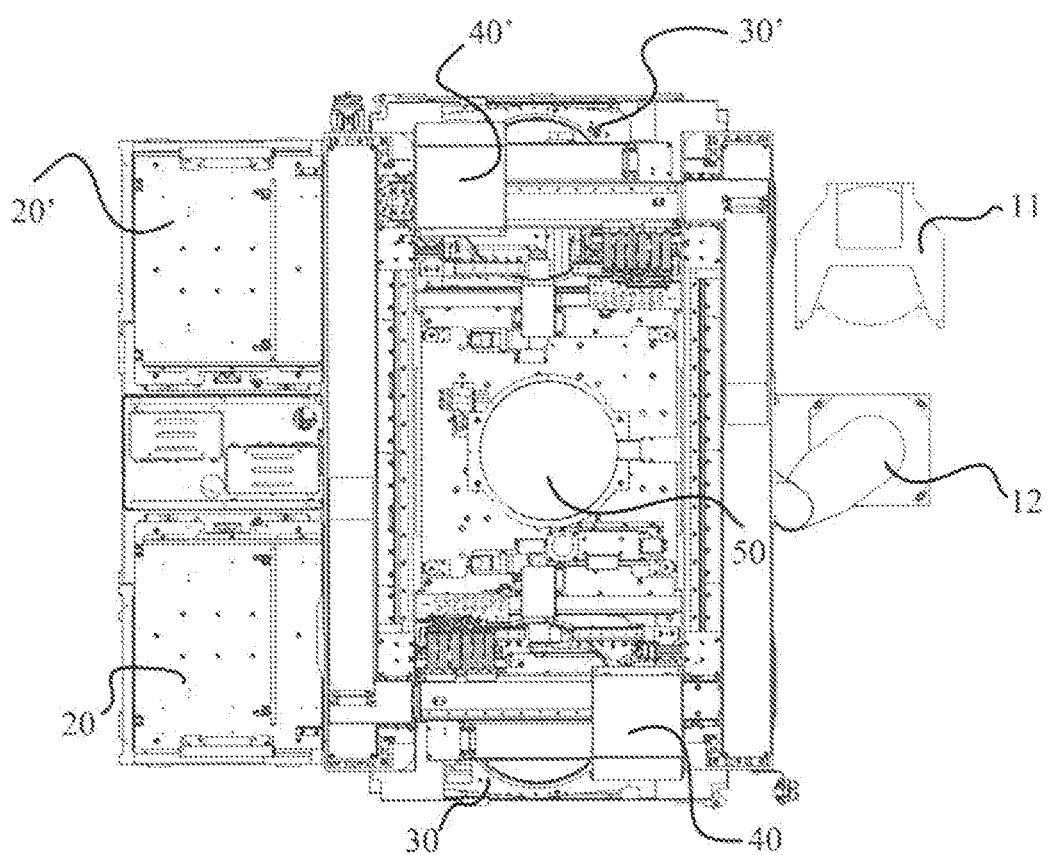
FIG. 3 is a top view of the chip packaging apparatus shown in FIG. 1, where part of housing and some devices are removed to better illustrate internal construction of the apparatus.

Referring to FIG. 2, it is a schematic view of the chip packaging apparatus shown in FIG. 1 after the partial housing has been removed. The substrate holder 11 and the robot 12 in the substrate supply part B are also removed to better show the internal structure. Referring to FIG. 3, it is a top view of the chip packaging apparatus shown in FIG. 1 after partial housing has been removed. Combining FIGS. 2 and 3, the chip supply part A includes an independently operated first chip supply device 20 and second chip supply device 20 which are symmetrically arranged in the longitudinal direction. The processor part C comprises a first chip processing device 30 and a second chip processing device 30', a first chip transfer device 40 and a second chip transfer device 40'. Each said pair are symmetrically arranged and independently operated. Those skilled in the art will understand from the spirit and principles of the present invention that the chip packaging apparatus according to the present invention may also have only one or more than two chip supply device (s), chip processing device (s), and chip transfer device (s), and such embodiments also fall within the scope of the invention. The first chip supply device 20 and the second chip supply device 20', the first chip processing device 30 and the second chip processing device 30', and the first chip transfer device 40 and the second chip transfer device 40' of the chip packaging apparatus according to the present invention, may be substantially the same or different, respectively. In the present embodiment, since the devices are the same, the following description only introduce the first chip supply device 20, the first chip processing device 30, and the first chip transfer device 40. In addition, the various devices in the apparatus according to the invention operate independently of each other under a unified control system.

Figure 4:
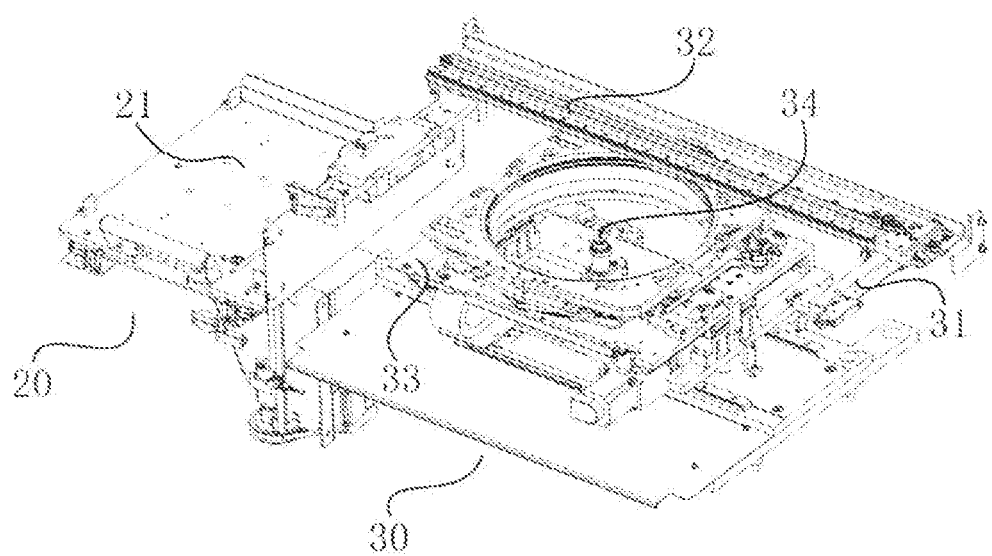
FIG. 4 is a partial perspective view of the chip supply device and the chip processing device of the chip packaging apparatus shown in FIG. 1.

Referring to FIG. 4, FIG. 4 is a partial perspective view of chip supply device 20 and chip processing device 30 of the chip packaging apparatus shown in FIG. 1. As shown, a pick station 21 in the chip supply device 20 is used to load the wafer cassette, and can be moved vertically to adjust to a suitable height. The chip processing device 30 comprises a gripper 31 that grabs a wafer from a wafer cassette. As shown in FIG. 4, the gripper 31 is supported on a slide rail 32 and can be movable along the slide rail 32. When the wafer is needed to be grasped, the gripper 31 moves along the slide rail 32 toward the wafer cassette. After grabbing a wafer from the wafer cassette, the gripper 31 moves toward the wafer table placing the wafer on the wafer table 33, and then continues moving away from the wafer table 33 till to a safe location. The wafer table 33 can be moved vertically and rotated to align the wafer. The camera on the wafer table 33 will then inspect the wafer for a good chip. Once the good chip is found, an ejector 34 on the wafer table 33 separates the chip from the wafer.

Figure 5:
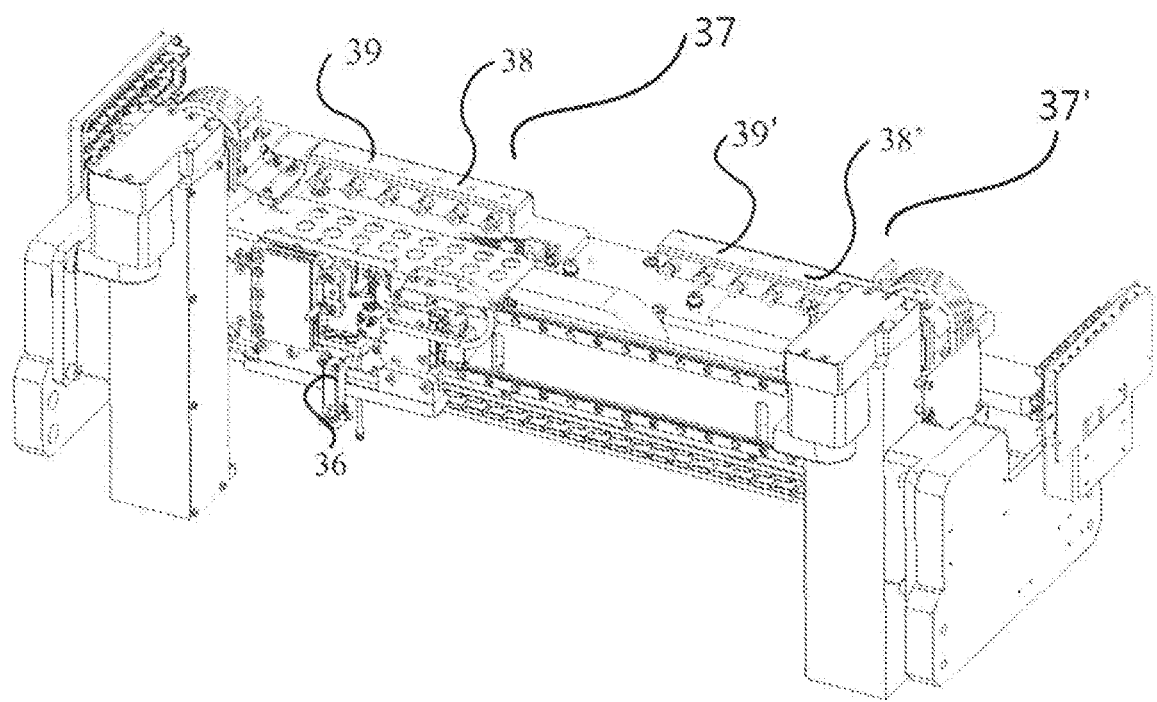
FIG. 5 is a partial perspective view of the chip processing device of the chip packaging apparatus shown in FIG. 1.

FIG. 5 is another partial perspective view of the chip processing device 30 of the chip packaging apparatus shown in FIG. 1. As shown in FIG. 5, the chip processing device 30 further comprises a gripper 36, and a first pick-up platform 37 and a second pick-up platform 37'. The gripper 36 is used to grasp the chips that have been separated on the wafer table 33 and place them on placement stations of pick-up platforms 37 and 37'. The first pick-up platform 37 and the second pick-up platform 37' shown in the figures have the same structure and function. Both of them are for receiving the chips transferred by the gripper 36. As shown, the pick-up platform 37 is provided with multiple placement stations 39. While the pick-up platform 37' is provided with multiple placement stations 39', each placement station holds a chip. The number of placement stations 39 on each pick-up platform is fixed. To this end, a variety of plates, each with a different number of stations, can be provided, so that the plate with the corresponding number of placement stations can be selected as needed before operation. Additionally, a vacuum device can be disposed on the pick-up platform for securing the chip that is placed on the plate.

Each of the pick-up platform of the chip packaging apparatus according to the present invention is movable between a loading position and a picking position. The pick-up platform is adapted to be loaded with multiple chips while in the loading position, and the pick-up platform can have the multiple bond heads simultaneously pick up the multiple chips while in the picking position. Referring to FIG. 5, each pick-up platform is vertically adjustable in height. When it is lowered to a height close to the gripper 36, the pick-up platform reaches the loading position. The gripper 36 can place the chips one by one on each placement station of the pick-up platform. Conversely, when it is raised to a position close to the bond heads, the pick-up platform reaches the picking position, and the multiple bond heads can simultaneously pick up the chips on the pick-up platform and transfer them to the substrate at one time. In addition, the first pick-up platform 37 and the second pick-up platform 37' are disposed to the alternately in the loading position and in the picking position. That is, when the first pick-up platform 37 is in the lower loading position, the second pick-up platform 37' is in the upper picking position. When the first pick-up platform 37 is filled with the chips and raised to the picking position for the bond heads to pick up, the chips on the second pick-up platform 37' have been removed by the bond heads and then the second pick-up platform 37' lowered to the lower loading position for the gripper 36 to load the chips. Such an arrangement can effectively improve efficiency of the apparatus. When the bond heads pick up the chips, it is necessary for the bond heads to check multiple chips on the pick-up platform one by one to determine whether the chips meet position requirements and other requirements, and make corresponding adjustments, which makes the gripping step very time-consuming. It is conceivable that in a chip packaging apparatus in which only one pick-up platform is provided, the chip separation step of the chip processing device must be stopped to wait for the completion of the chip gripping step. In contrast, in the present invention, since two pick-up platforms are disposed alternately in the loading position and in the picking position, when one pick-up platform completes the loading step and continues to the picking-up step, the chip processing devices can keep working. The chip loading step can be implemented on another pick-up platform. Thereby the apparatus realizes the uninterrupted work of the chip processing device, and improves the efficiency of the chip packaging device.

Figure 6:
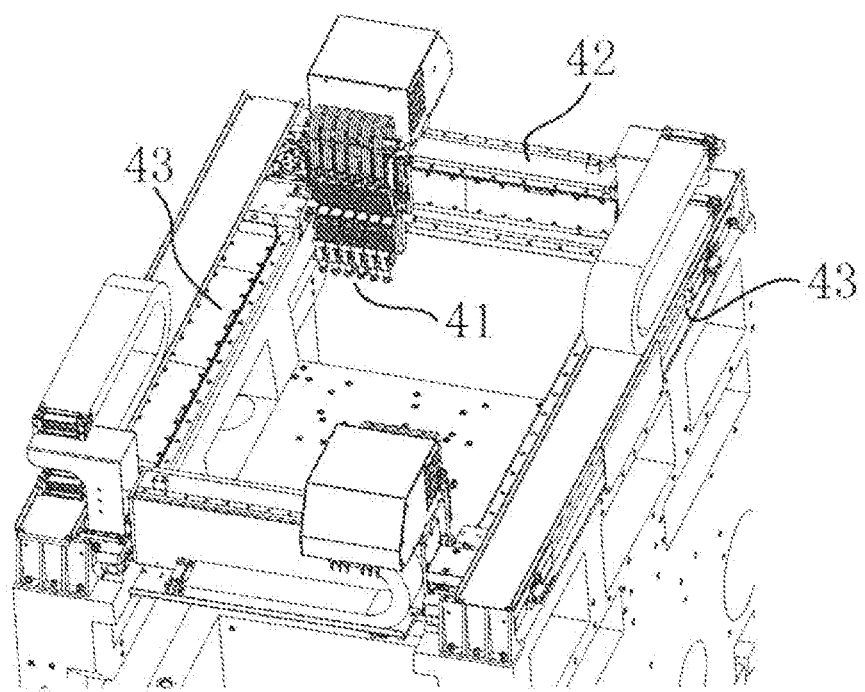
FIG. 6 is a partially enlarged perspective view of the chip packaging apparatus shown in FIG. 1, mainly showing the chip transfer device.
Figure 7:
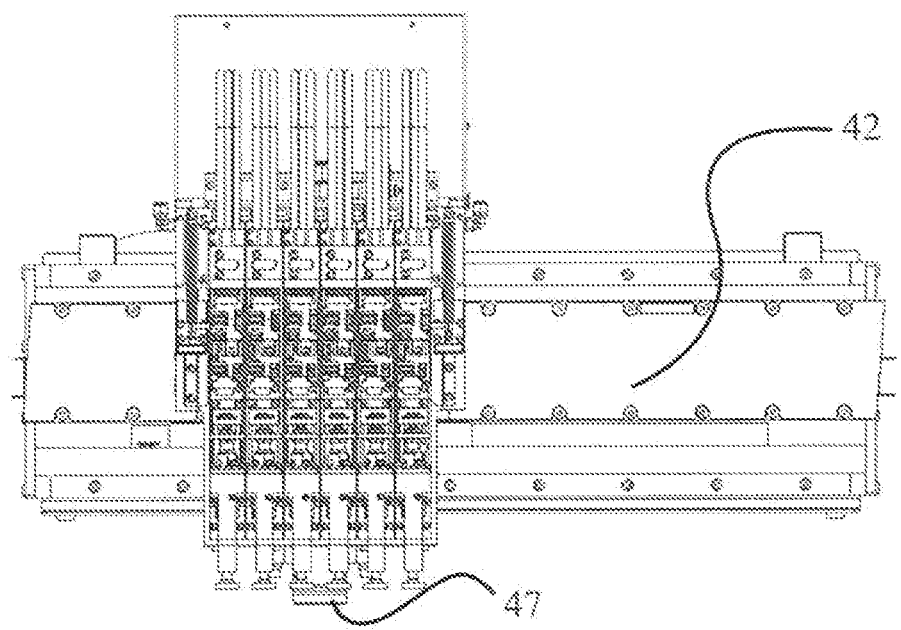
FIG. 7 is A partially enlarged perspective view of the bond heads of the chip transfer device shown in FIG. 6.

Referring to FIGS. 6 and 7, the chip transfer device 40 in the chip packaging apparatus will be described in detail. As shown, the chip transfer device 40 mainly comprises multiple bond heads 41 (six bond heads in the FIG. 6 or 7) mounted together and a driving mechanism (not shown) and camera 47. The camera 47 is used to check whether the position of the chips on the pick-up platform meets the requirements or the like. The bond head 41 is mounted on a beam 42, and the ends of the beam 42 are respectively mounted on the two longitudinal rails 43. The multiple bond heads 41 can be moved together along the beam 42 in the length direction of the beam 42, and the beam 42 can be moved along the longitudinal rails 43, thereby enabling the multiple bond heads 41 to move together in horizontal and vertical direction. Further, the multiple bond heads 41 are disposed to be independently movable in the vertical direction relative to the beam 42, and disposed to be independently rotatable around respective axis. Accordingly, the bond heads 41 have sufficient freedom of movement to perform any fine movement to complete a precise operation process. Further, the horizontal distance between the bond heads 41 can also be adjusted such that each of the bond heads 41 is aligned with the corresponding placement station 39 of the plate 38 on the pickup platform 37.

Figure 8:
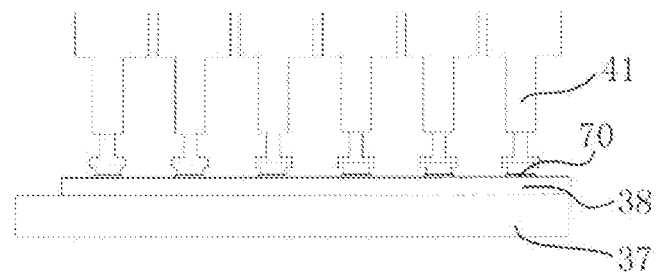
FIG. 8 is a schematic view of multiple bond heads of the chip packaging device of FIG. 1 when picking up a chip.

Multiple bond heads on the chip transfer device on the apparatus according to the present invention are configured to pick up multiple chips simultaneously from the pick-up platform at a time. Referring to FIG. 8, each bond head 41 on the chip transfer device is aligned with the chip 70 on the plate of the pick-up platform 37, so that multiple bond heads can pick up multiple chips 70 simultaneously from the pick-up platform at one time. Compared with the bond heads in the prior art, such arrangement directly detects, selects, aligns, and picks up the chip one by one from the wafer, which can greatly improve the production efficiency of the apparatus.

Figure 9:
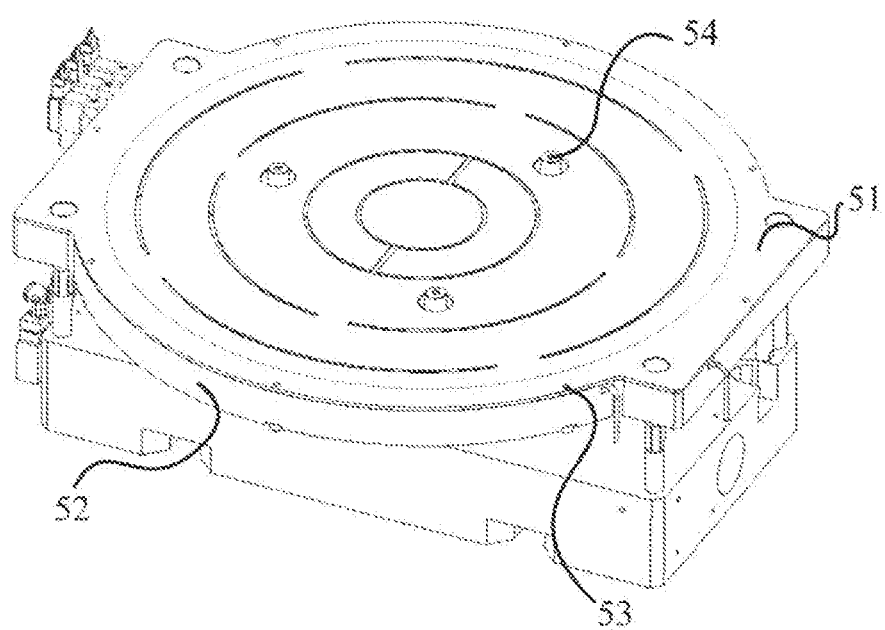
FIG. 9 is a schematic view of the bonding platform of the chip packaging apparatus of FIG. 1.

FIG. 9 shows a schematic view of a bonding platform 50 in the chip packaging apparatus shown in FIG. 1. The bonding platform 50 is disposed at an approximately intermediate position of the chip packaging apparatus, as shown in FIG. 1. Referring to FIG. 9, the bonding platform 50 comprises a support plate 51 for supporting the substrates. The support plate 51 is provided with a plurality of vacuum holes 53 for providing a negative pressure to adsorb and to fix the substrates on the support plate 51. A plurality of struts 54 that can be controlled to move up and down are also provided on the support plate 51. Below the support plate is provided a heating plate 52 which can be activated to heat the support plate 51. During operation, the robot arm 12 grabs the substrate from the substrate holder 11 and places it over the support plate 51, at which time the struts 54 are raised above the surface of the support plate and thus the substrate is actually supported by the struts. Thereafter, the robot arm 12 is removed and the struts 54 are retracted below the support plate so that the wafer is supported by the support plate. Thereafter, the heating device, i.e., the heating plate 52, is activated, and the heat of the heating plate 52 is transferred to the support plate 51 and further transferred to the substrate. When the substrate is heated to a suitable temperature, the chip attached to the substrate is firmly bonded to the substrate because the adhesive at the bottom of chip is melted.

Figure 10A:
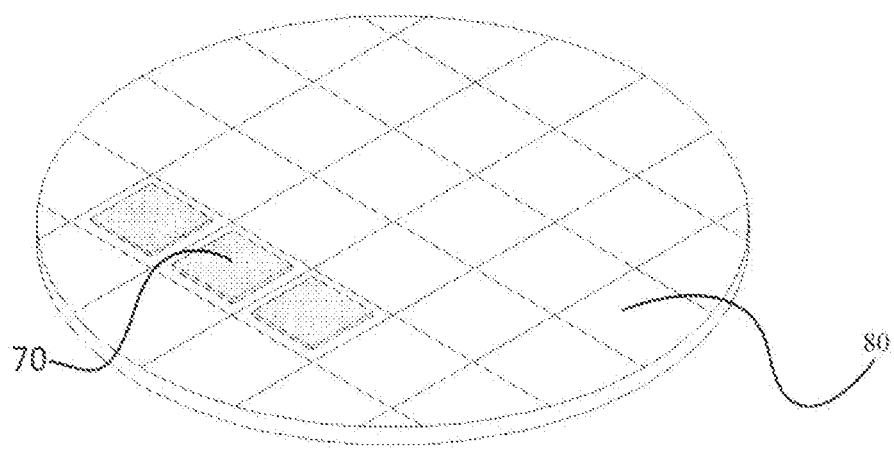
FIGS. 10A-10C illustrate several bonding situations that can be implemented using the apparatus of the present invention.
Figure 10B:
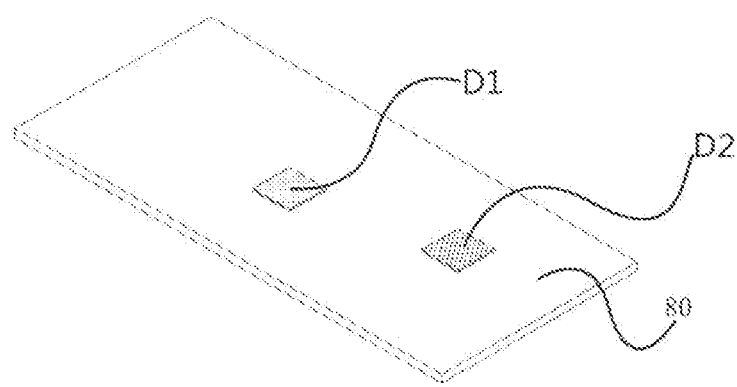
Figure 10C:
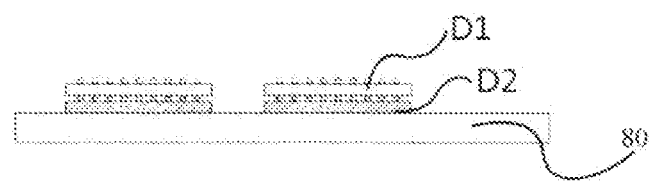

FIGS. 10A-10C illustrate several specific situations that may be implemented using the chip packaging apparatus of the present invention. As shown in FIG. 10A, the apparatus of the present invention can be used to bond the same chips 70 to a substrate 80, in which case the first chip supply device and the second chip supply device provide the same type of wafers during processing. Same chips are processed by two independently working chip processing devices and chip transfer devices and transferred to the single substrate for bonding. Referring to FIGS. 10B and 10C, by providing different types of wafers in the first chip supply device and the second chip supply device, different chips D1 and D2 are processed by two independently working chip processing devices and chip transfer devices, and transferred to the single substrate for bonding. That is, this embodiment enables processing of two different types of chips in a single machine, and bonding of two different types of chips on the same substrate. Among them, FIG. 10B realizes that different types of chips are respectively bonded to the substrate, and FIG. 10C realizes that a chip D1 is bonded to the other chip D2. Those skilled in the art will understand, based on the spirit and principles of the present invention, that more devices can be added to the chip packaging apparatus so that more different types of chips can be bonded on the same substrate to achieve more complicated processing.

A method for packaging a chip according to the present invention will be described in detail below. As an example, the method is implemented according to the flow chart shown in FIG. 11 and is implemented by the apparatus as shown in FIG. 1. However, it should be noted that the chip packaging method similar to the present invention can also be used to package suitable components and elements other than the chips, and can also be implemented using other devices than the device shown in FIG. 1.

Figure 11:
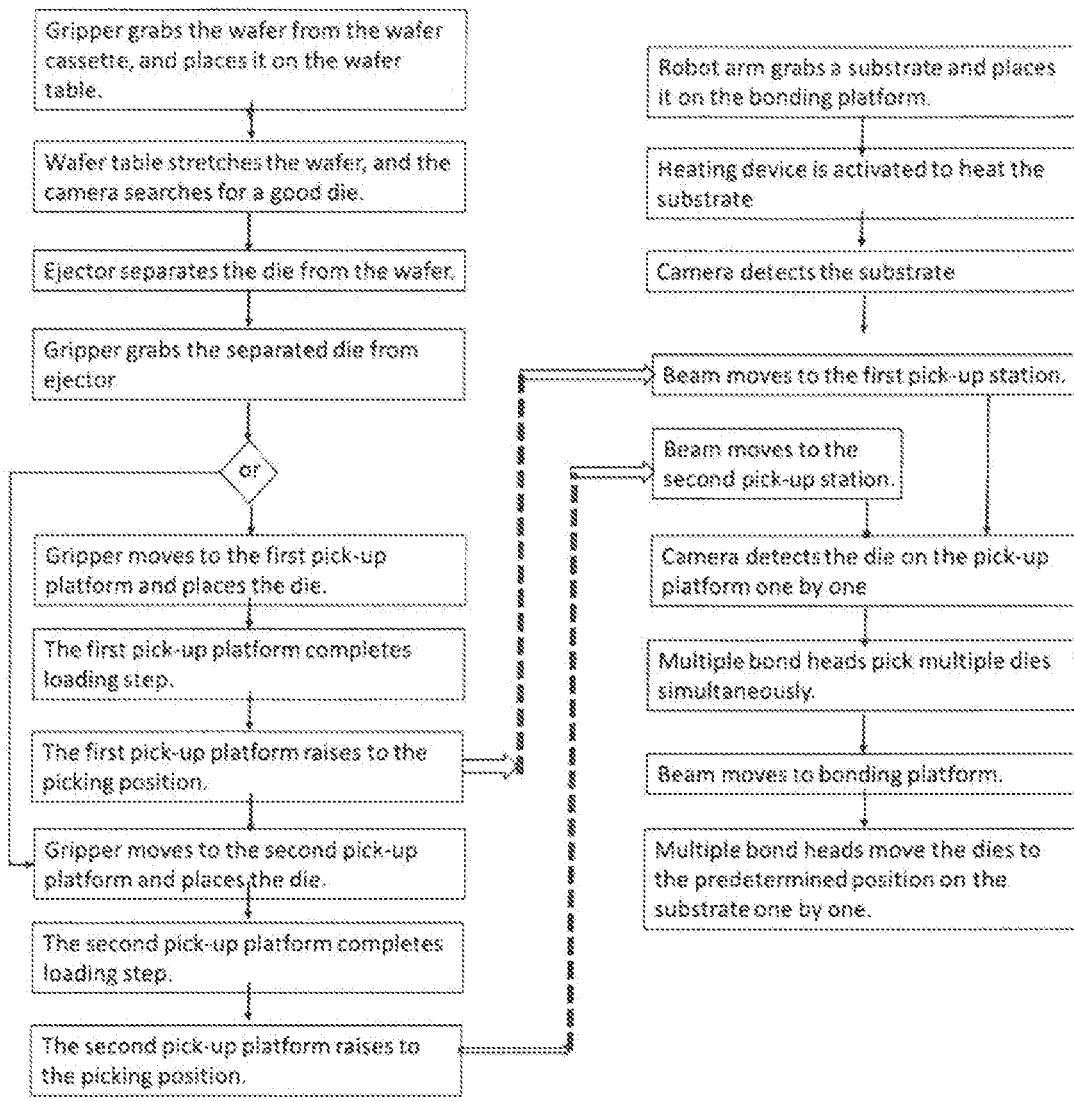
FIG. 11 is a schematic view of the picking step of the method in FIG. 9.

Referring to FIG. 11, the main steps of the exemplary method are listed in detail. For the processing operation, it is first necessary to add a wafer cassette to the chip supply part, and load the substrate to the bonding platform by the robot arm. Thereafter, the chip packaging apparatus is activated. The first pick-up platform in the chip processing device is lowered to the loading, position, and the second pick-up platform is raised to the picks-up position. At the same time, the gripper in the chip processing device will grab the wafer from the wafer cassette under control of the control system of the apparatus, and place the wafer on the wafer table. The wafer table will stretch the wafer in order for the camera to detect the wafer and to find chips in good condition, and separate the chips from the wafer through the ejector. Thereafter, the gripper grabs the separated chips and places them on the predetermined placement stations of the first pick-up platform. When there are enough chips loaded onto the first pick-up platform, the first pick-up platform arises to the picking position, and the bond heads move to the first pick-up platform, and the camera therein detects whether the positions of the respective chips are aligned to target positions. After the positions of the respective chips meet the requirements, the multiple bond heads simultaneously grab the multiple chips on the first pick-up platform at one time. Then, the bond heads continue to move to the bonding platform, and place the multiple chips one by one on a predetermined position on the substrate. While the first pick-up platform is filled with chips and raised to the picking position for the bonding heads to pick up, the second pick-up platform 37' is lowered to the loading position. The gripper grabs the separated chips and places them onto the predetermined placement stations of the second pick-up platform until the second pick-up platform is filled with chips. For example, the system of the apparatus can be structured such that when one of the pick-up platforms is full of chips, the chips on the other pick-up platform are detected and removed by the chip transfer device, just right. Thus, when the second pick-up platform is filled with the chips and raised to the picking position, the chips on the first pick-up platform are just removed by the bond heads and then the first pick-up platform are lowered to the loading position. Thus, in the present invention, two pick-up platforms are provided and are arranged to be alternately in the loading position and in the picking position. Thereby, the chip processing apparatus can continue to work to implement the chip-loading step on the other pick-up platform while the chip processing apparatus completes the loading step and begins picking step on one pick-up platform, thereby realizing the uninterrupted work of the chip processing device, and effectively improving the efficiency of the chip packaging apparatus.

The invention has been described above by one or more preferred examples and one or more alternative embodiments. In addition, various aspects of the invention are also described. The various aspects or embodiments should not be construed as limited, but should be construed as illustrative. It is to be understood that the scope of the invention will be determined by the claims.

What is claimed is:

1. A chip packaging apparatus, comprising:
    at least two chip supply devices;
    at least two chip processing devices, which are configured to process multiple chips provided by a corresponding one of the at least two chip supply devices;
    at least two chip transfer devices, each chip transfer device respectively having multiple bond heads, and each bond head transferring one of the multiple chips which are processed by a corresponding one of the at least two chip processing devices;
    wherein each of the at least two chip processing devices further comprises at least a first pick-up platform and a second pick-up platform, each of the first and second pick-up platforms is configured to simultaneously arrange the multiple chips; and the multiple bond heads on the corresponding chip transfer device are configured to pick up the multiple chips simultaneously from each of the first and second pick-up platforms at one time;
    wherein the at least two chip processing devices and the at least two chip transfer devices are disposed on the same side of the at least two chip supply devices;
    each of the corresponding one of the at least two said chip processing devices is configured such that the first pick-up platform and the second pick-up platform are alternately in a loading position and in a picking position; and
    the first pick-up platform and the second pick-up platform are configured to be vertically adjustable in height in order to move between the loading position and picking position.

2. The chip packaging apparatus according to claim 1, wherein each one of the at least the two chip supply devices, with the corresponding one of the at least the two chip processing devices and the corresponding one of the at least the two chip transfer devices form a set, wherein each set is disposed symmetrically relative to the other sets and each set is operated independently of the other sets.

3. The chip packaging apparatus according to claim 1, wherein each of the first and second pick-up platforms is movable between a loading position and a picking position, said first and second pick-up platforms are adapted to be loaded with the multiple chips while in the loading position, and said first and second pick-up platforms are adapted to have the multiple bond heads simultaneously pick up the multiple chips while in the picking position.

4. The chip packaging apparatus according to claim 3, wherein the at least two chip transfer devices are correspondingly disposed above the at least two chip processing devices.

5. The chip packaging apparatus according to claim 1, wherein the chip packaging apparatus further comprises a bonding platform, and the bond heads of each chip transfer device are configured to bond multiple chips to a substrate is disposed on the bonding platform.

6. The chip packaging apparatus according to claim 5, wherein the bonding platform is provided with a heating device, and the heating device is adapted to heat the substrate disposed on the bonding platform.

7. A method of packaging chips operatively associated with a chip packaging apparatus, the method comprising:
    providing the chip packaging apparatus comprising:
        at least two chip supply devices;
        at least two chip processing devices, which are configured to process multiple chips provided by a corresponding one of the at least two chip supply;
        at least two chip transfer devices, each chip transfer device respectively having multiple bond heads, and each bond head transferring one of the multiple chips which are processed by a corresponding one of the at least two chip processing devices;
        wherein each of the at least two chip processing devices further comprises at least a first pick-up platform and a second pick-up platform, each of the first and second pick-up platforms is configured to simultaneously arrange the multiple chips; and the multiple bond heads on the corresponding chip transfer device are configured to pick up the multiple chips simultaneously from each of the first and second pick-up platforms at one time;
        wherein the at least two chip processing devices and the at least two chip transfer devices are disposed on the same side of the at least two chip supply devices;
        each of the corresponding one of the at least two said chip processing devices is configured such that the first pick-up platform and the second pick-up platform are alternately in a loading position and in a picking position; and
    the first pick-up platform and the second pick-up platform are configured to be vertically adjustable in height in order to move between the loading position and picking position;
    moving the first pick-up platform and the second pick-up platform alternately in the loading position and in the picking position, wherein each of the first pick-up platform and the second pick-up platform is adapted to be loaded with the multiple chips in said loading position, and each of the first pick-up platform and the second pick-up platform is adapted to have the multiple bond heads, which are disposed on the corresponding one of the at least two chip transfer device, simultaneously pick up the multiple chips in said picking position.

8. The method according to claim 7, wherein the first chip processing device and the second chip processing device process different types of chips independently.

9. The method according to claim 7, wherein the chip packaging apparatus further comprises a bonding platform, the method further comprising placing a substrate on the bonding platform and bonding the chip to the substrate by the bond head.

10. The method according to claim 9, wherein the method further comprises activating a heating device on the bonding platform, to heat the substrate disposed on the bonding platform.

11. The method according to claim 7, wherein the chip transfer device is further provided with a camera, the method further comprising detecting the multiple chips on the pick-up platform one by one to determine whether the position of each chip meet the requirements.

12. The method according to claim 7, wherein the chip transfer device places the chips onto the substrate one by one to perform bonding.

* * * * *